United States Patent [19]

Niki et al.

[11] Patent Number: 5,098,852
[45] Date of Patent: Mar. 24, 1992

[54] METHOD OF MANUFACTURING A SEMICONDUCTOR DEVICE BY MEGA-ELECTRON VOLT ION IMPLANTATION

[75] Inventors: Yoshiko Niki, Tokyo; Soichi Nadahara, Inagi; Masaharu Watanabe, Kawasaki, all of Japan

[73] Assignee: Kabushiki Kaisha Toshiba, Kawasaki, Japan

[21] Appl. No.: 548,548

[22] Filed: Jul. 5, 1990

[30] Foreign Application Priority Data

Jul. 5, 1989 [JP] Japan .................. 1-173559

[51] Int. Cl.$^5$ .................. H01L 21/306; H01L 21/265
[52] U.S. Cl. .................. 437/11; 437/12; 437/26
[58] Field of Search .................. 437/10, 11, 12, 26, 437/43, 47, 52, 950; 148/DIG. 24, DIG. 60, DIG. 144; 357/23.6, 29

[56] References Cited

U.S. PATENT DOCUMENTS

| | | | |
|---|---|---|---|
| 3,933,530 | 1/1976 | Mueller et al. | 148/1.5 |
| 4,249,962 | 2/1981 | Celler | 148/1.5 |
| 4,328,610 | 5/1982 | Thompson et al. | 29/571 |
| 4,371,403 | 2/1983 | Ikubo et al. | 148/1.5 |
| 4,401,506 | 8/1983 | Otsuka | 156/612 |
| 4,575,466 | 3/1986 | Iwai et al. | 427/53.1 |
| 4,617,066 | 10/1986 | Vasudev | 437/27 |
| 4,716,451 | 12/1987 | Hsu et al. | 357/42 |
| 4,889,819 | 12/1989 | Davari et al. | 437/27 |

FOREIGN PATENT DOCUMENTS

| | | | |
|---|---|---|---|
| 55-65438 | 5/1980 | Japan | 437/11 |
| 56-105641 | 8/1981 | Japan | 437/11 |
| 57-177530 | 11/1982 | Japan | 437/11 |
| 58-137244 | 8/1983 | Japan | 437/11 |
| 0180028 | 10/1983 | Japan. | |
| 34932 | 2/1990 | Japan. | |

OTHER PUBLICATIONS

Bogardus et al., IBM Technical Disclosure Bull., vol. 16, No. 4 (Sep. 1973), pp. 1066-1067.
Proximity gettering with mega-electron volt carbon and oxygen implantations, Appl. phys. Lett, 52.1023 (1988) H. Wong, N. W. Cheung P. K. Chu, J. Liu and J. W. Mayer.
High-Energy Ion Implantation Gettering Extended Abstracts (The 50th Autumn Meeting, 1989); the Japan Society of Applied Physics, No. 2, p. 608 29a-A-3.

Primary Examiner—Olik Chaudhuri
Assistant Examiner—Loc Q. Trinh
Attorney, Agent, or Firm—Oblon, Spivak, McClelland, Maier & Neustadt

[57] ABSTRACT

A method of manufacturing a semiconductor device includes forming desired semiconductor elements in a major surface region of a semiconductor substrate, and ion-implanting a selected element into the semiconductor substrate from the major surface of the substrate to form an ion-implanted layer by the implanted element. A heat treatment is performed to the ion-implanted substrate, causing the ion-implanted layer to getter contaminant heavy metals.

12 Claims, 9 Drawing Sheets

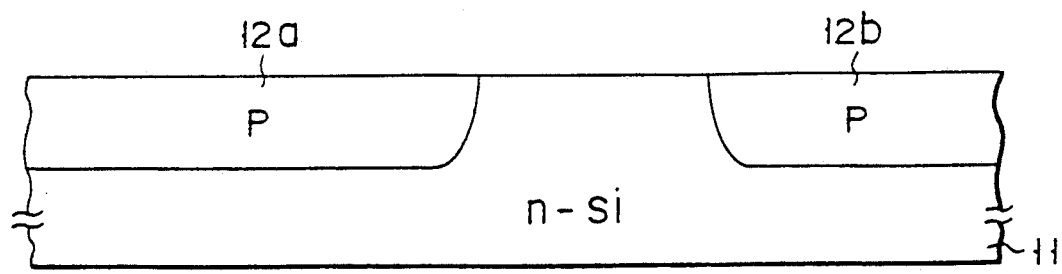
F I G. 1A
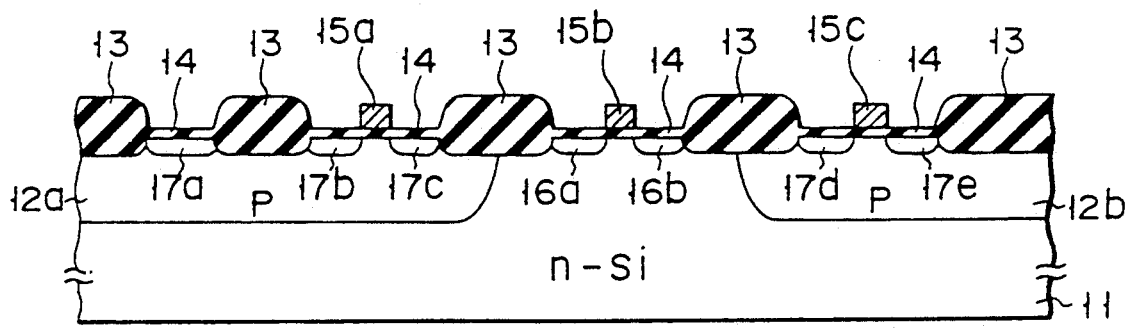
F I G. 1B
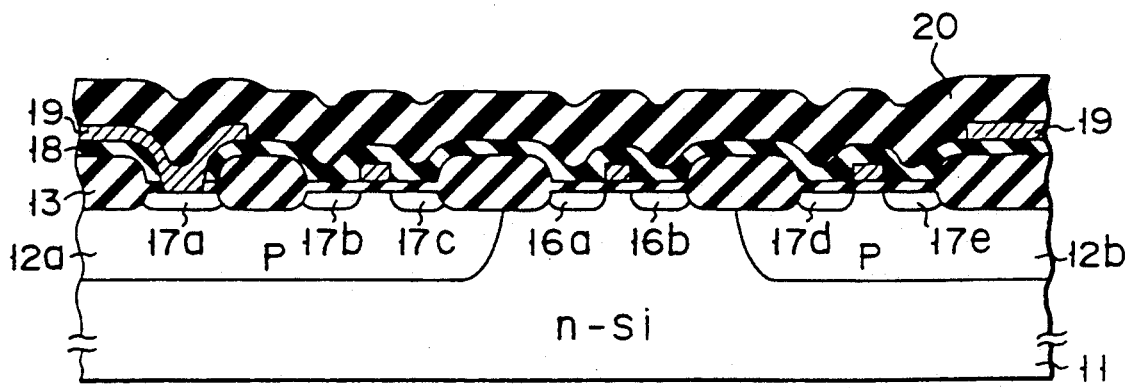
F I G. 1C

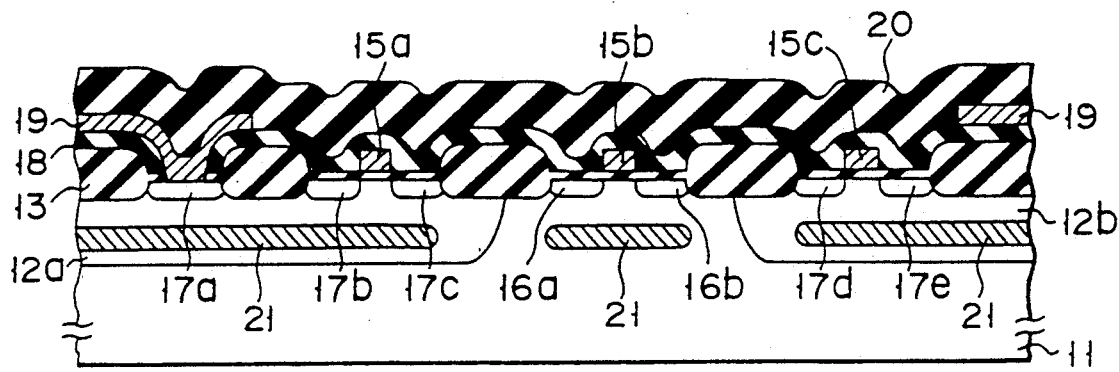
F I G. 1D
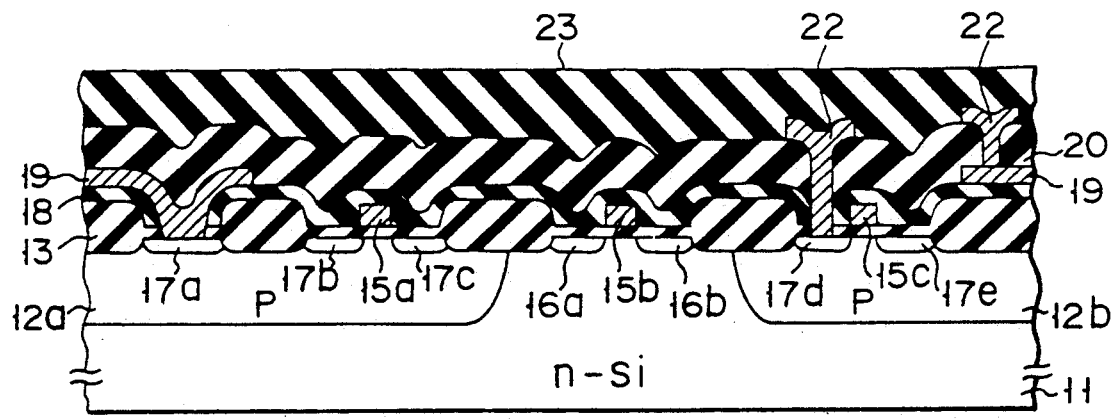
F I G. 1E

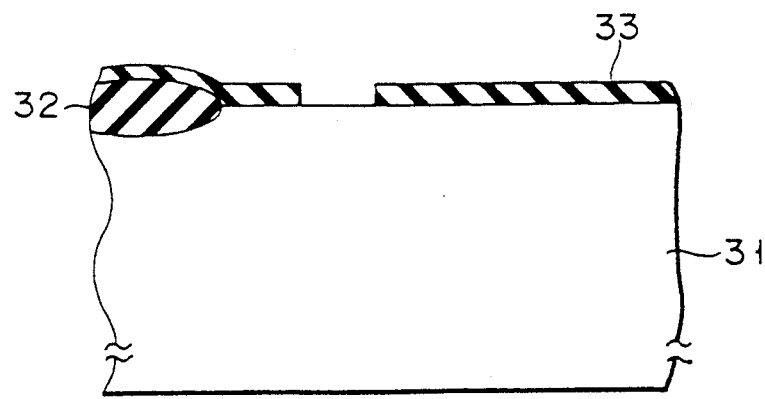
F I G. 3A
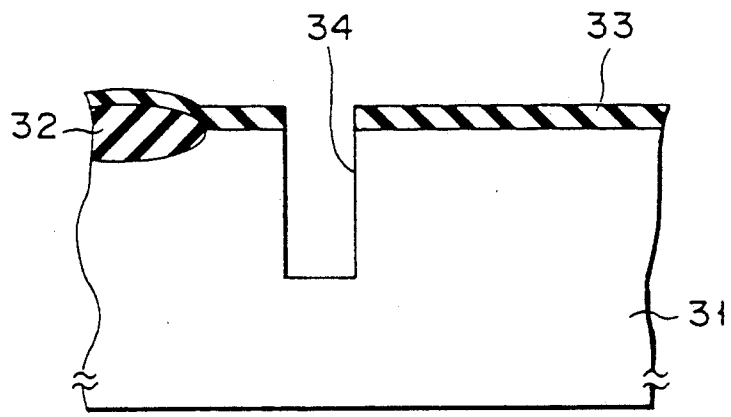
F I G. 3B
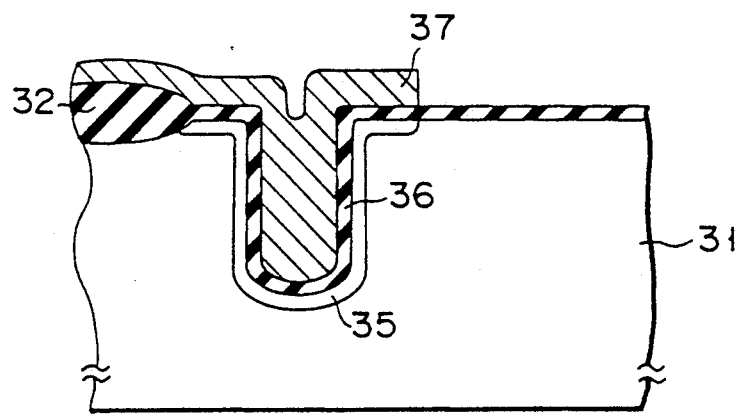
F I G. 3C

METHOD OF MANUFACTURING A SEMICONDUCTOR DEVICE BY MEGA-ELECTRON VOLT ION IMPLANTATION

BACKGROUND OF THE INVENTION

1. Field of the Invention

The present invention relates to a method of manufacturing a semiconductor device having improved characteristics, by means of gettering technique.

2. Description of the Related Art

Contaminants, such as the unwanted impurities (heavy metals, among others) unavoidably introduced into a semiconductor substrate in the manufacture of a semiconductor device, form centers which trap and release free electrons (or holes), causing a leakage current flowing at a pn junction. The leakage current degrades electrical characteristics of the semiconductor device. In a MOS semiconductor element, for example, such a leakage current reduces the mutual conductance or the like, inevitably decreasing the yield of the semiconductor device. The heavy metals, even if existing in a very small amount, may greatly reduce the yield or characteristics of the semiconductor device, particularly where the device has a more limited size and yet comprises a greater number of elements, as has been being done recently.

To prevent such contamination, gettering is performed to absorb heavy metals. More specifically, the back of a semiconductor substrate is mechanically damaged, or impurities are introduced into the back of the substrate in high concentration, in order to absorb the heavy metals. In order to achieve this back-surface treatment successfully, an additional step must be carried out in order to prevent contamination from the front surface of the substrate, or the substrate must be heated at high temperature for a long time. The prolonged heat treatment is, in most cases, detrimental to the manufacture of a microstructure device. Further, the back-surface treatment is one of the initial steps of manufacturing the semiconductor device, and its effect gradually lessens as the succeeding heat treatments or thermal steps are performed.

Soft error, which is caused by excess carriers generated upon application of radiation such as $\alpha$-rays, is a problem prominent to semiconductor memories. It is regarded as a great problem, in particular, to 64 KB dynamic RAMs and dynamic RAMs having greater memory capacities, and also as an equally great problem to static RAMs having high-resistance load cells. Soft error is discussed in "LSI HANDBOOK" edited by The Institute of Electronics and Communication Engineers of Japan, pages 677–678, Nov. 30, 1984, published by OHM Inc., Japan.

Various methods are taken to prevent soft error. Among these methods are: to reduce the amount of the $\alpha$-ray sources, such as U and Th, contained in the package material (i.e., resin composition); to design the circuitry to increase the critical charge at the expense of the number of bit lines and the sensitivity of the sense amplifier; and to coat the LSI chip with a resin layer thick enough to prevent the $\alpha$-ray penetration into the chip. The $\alpha$-ray penetration from within and without the package can be reduced to a minimum by, for example, forming an $\alpha$-ray shield made of polyimide resin or the like on the LSI chip which has been passivated. However, radioactive elements such as U and Th may be contained also in the Al layers or the high-melting metal layers which are formed on the LSI chip, and the shield of polyimide resin cannot block the radiation from these metal layers. Further, coating of polyimide resin may raise another technical difficulty in resin-packaging the LSI chip. Hence, it is desirable that the LSI chip itself be made resistant to soft error.

Also in a static RAM, the data charge accumulated in each memory node is so small that the data may be destroyed when the memory node is applied with an electrical charge generated when the $\alpha$-rays penetrate into the static RAM. When $\alpha$-rays hit the $n^+$ layer located in the memory node, in particular, funneling takes place, generating carriers which flow back along the loci of the $\alpha$-rays and absorbed into the memory node efficiently, inevitably causing a soft error.

As has been pointed out, in order to prevent contamination by heavy metals, it has hitherto been necessary to perform an additional step of preventing contamination from the front surface of the substrate in the backside gettering technique. In addition, since the gettering site is formed in one of the initial steps of manufacturing the semiconductor device, the effect of the gettering gradually lessens as the succeeding thermal steps are performed. Further, to achieve the gettering successfully, the substrate must be heated at high temperature for a long time, but the prolonged heat treatment is, in most cases, detrimental to the manufacture of a microstructure device.

Further, in semiconductor memory devices, soft error occurs due to excess carriers generated by $\alpha$-rays.

SUMMARY OF THE INVENTION

Accordingly it is an object of the present invention to provide a method of manufacturing a semiconductor device, in which gettering can be performed with high efficiency.

It is a second object of the invention to provide a method of manufacturing a semiconductor device, in which a gettering site can be formed adequately near the active region of the device, without requiring an additional high-temperature treatment and without degrading the characteristics of the device, thereby helping to improve the yield of the semiconductor elements incorporated in the device.

It is a third object of the invention to provide a method of manufacturing a semiconductor device, in which excess carriers resulting from radiation such as $\alpha$-rays can be trapped in a region of the device other than the active region thereof, thus improving the soft-error resistance of the device, and also enhancing the yield and reliability of the semiconductor memory elements incorporated in the device.

The gist of this invention resides in that a gettering site is formed on the front side of a semiconductor substrate, by ion-implantation into a region of the substrate, which is deeper than an pn junction formed in the substrate, and does not reach the depletion layer of the element formed in the substrate, and gettering is effectively performed on the front side of the substrate by heating under optimal conditions.

In one aspect of the present invention, there is provided a method of manufacturing a semiconductor device, comprising the steps of:

forming desired semiconductor elements in a major surface region of a semiconductor substrate by forming a plurality of device active regions, including pn-junctions and interconnection layers;

ion-implanting a p-conductivity imparting impurity into the semiconductor substrate from the major surface thereof, thereby forming gettering sites by the implanted ions; an performing a heat treatment to the semiconductor substrate in which said gettering sites have been formed, at a predetermined temperature, causing said gettering sites to getter contaminant elements.

In another aspect of the present invention, there is provided a method of manufacturing a semiconductor device, comprising the steps of:

forming desired semiconductor elements, including device active regions and interconnections, in a major surface region of a semiconductor substrate through thermal steps performed at a predetermined relatively high temperature;

ion-implanting a selected element into the semiconductor substrate in which said semiconductor elements have been formed, from the major surface thereof, thereby forming an ion-implanted layer by the implanted ions, located at a position close to and deeper than a depletion layer formed in the semiconductor substrate when a predetermined operating voltage is applied to the semiconductor device; and performing a heat treatment at a relatively low temperature lower than said predetermined relatively high temperature, causing said ion-implanted layer to getter contaminant elements.

In still another aspect of the present invention, there is provided a method of manufacturing a semiconductor device, comprising the steps of:

forming desired semiconductor elements in a major surface region of a semiconductor substrate by forming a plurality of device active regions, including pn-junctions and interconnection layers;

ion-implanting a conductivity-imparting impurity into the semiconductor substrate from the major surface thereof, thereby forming an ion-implanted layer by the implanted ions; and performing a heat treatment at a predetermined high temperature, causing said ion-implanted layer to getter contaminant elements, and activating the ion-implanted layer to function as a conductive layer.

BRIEF DESCRIPTION OF THE DRAWINGS

FIGS. 1A to 1E are sectional views for illustrating a method of manufacturing a CMOS device, according to an embodiment of the present invention;

FIGS. 3A to 3E are sectional views for illustrating a method of manufacturing a dynamic RAM cell, according to another embodiment of the present invention;

DETAILED DESCRIPTION OF THE PREFERRED EMBODIMENTS

Figure 2:
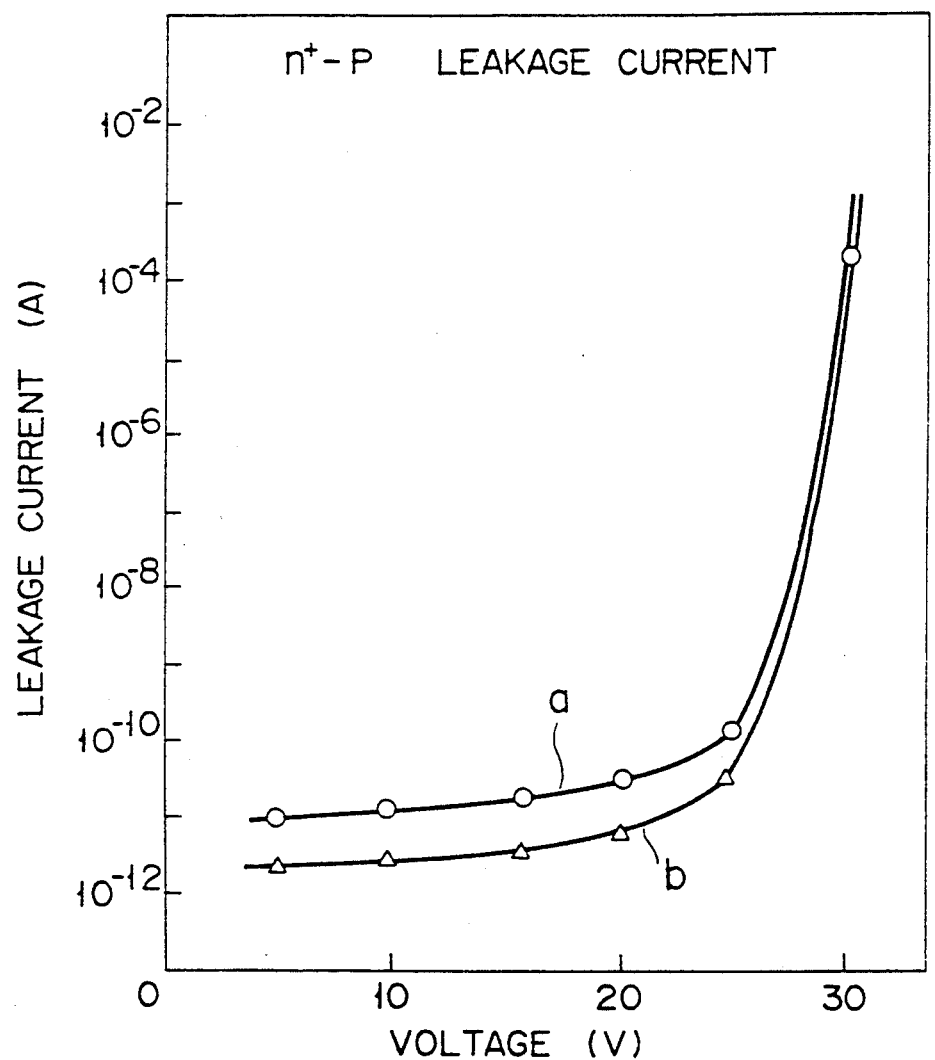
FIG. 2 is a graph representing voltage-leakage current characteristics of the MOS transistors manufactured according to the above embodiment of the invention and of a comparative MOS transistor.

The inventors hereof studied the gettering techniques hitherto known and also repeated experiments in their efforts to develop a more efficient gettering technique. The results of their study and experiments have shown that a gettering site which absorbs transition metals (iron, nickel, copper, etc.) efficiently can be formed by ion-implanting boron into the front (i.e., semiconductor element-formed surface) of a semiconductor substrate, not from the back of the substrate as in the conventional method. The gettering site, thus formed, is composed of not crystal defects resulting from the ion-implantation, but the elements ion-implanted into the semiconductor substrate. It is believed that this efficient gettering site can be formed not only by ion-implanting boron into the substrate, but also by ion-implanting, in general, an impurity element which imparts p-type conductivity to a Group IV semiconductor, such as gallium, aluminum, and indium.

The gettering of the transition metals, which is performed during the heat treatment applied on the substrate after the gettering site has been formed, is very effective when the heat treatment is carried out at high temperatures, in particularly at 800° C. or more. It is desirable that the substrate be not exposed to such great heat during the period between the forming of the gettering site and the start of gettering. This high-temperature gettering can make part of the ion-implanted layer function as a conductive layer (e.g., a buried conductive layer), since it activates the ion-implanted layer. In this case, that portion of the ion-implanted layer which is closer to the front major surface of the substrate functions as the conductive layer, and the deeper portion of the ion-implanted layer functions as the gettering region. Impurity elements, which may be used to form this conductive layer, include boron and boron fluoride.

Efficient gettering can be achieved at a relatively low temperature, too, after the gettering site has been formed by the ion-implantation of the p-type conductivity imparting impurity noted above. Hence, the gettering site can be formed after all heat treatments or thermal steps have been performed on the substrate at relatively high temperatures (higher than 600° C.), thus forming desired semiconductor elements, including device active regions, pn-junctions, interconnections, insulating layers and the like, in the substrate, and efficient gettering can then be carried out at relatively low temperatures, preferably 300° to 600° C., thereby imposing no thermal influence on the semiconductor elements formed. In this specific scheme, in addition to the p type impurity (particularly boron), carbon, oxygen, or silicon can be used as an ion-implantation element, since defect clusters formed by the ion implantation also provide the gettering sites.

The inventors have also found that the ion-implantation of specific elements can help to form not only a gettering site, but also centers of trapping free electrons or holes, which trap the excess carriers generated when the α-rays penetrates into the the substrate, thereby to prevent the semiconductor memory elements from making soft errors.

No additional heat treatment needs to be performed solely to accomplish the gettering. Any heat treatment or thermal step carried out, for specific purposes other than gettering, in manufacturing the semiconductor device can serve to achieve gettering as well. Such a heat treatment or thermal step includes, to mention a few, the heat treatment or thermal step performed at a temperature higher than 800° C. for thermal oxidation, diffusion or annealing for activation of impurity regions, the heat treatment or thermal step effected at a temperature higher than 600° C. but not exceeding 800° C. for low temperature deposition of silicon nitride, poly-Si or $SiO_2$, or the heat treatment or thermal step carried out at a temperature of 300° C. to 600° C. for sintering, or atmospheric pressure deposition of insulating films ($SiO_2$, BSG or BPSG). All steps other than the step of ion-implantation for forming a gettering site and the step of performing gettering may be those generally performed in the art, such as the steps of forming impurity regions, the steps of forming interconnection layers, the step of carrying out passivation, the steps of performing photolithography, and the steps of effecting heat treatments.

The ion-implantation for the formation of the gettering sites is preferably conducted such that the resulting ion-implanted layer has a size substantially equal to or larger than that of the entire surface region of the substrate in which all the semiconductor regions or elements are formed. However, the ion-implanted layer is selectively formed such that each ion-implanted layer has a size equal to or slightly larger than that of the surface region in which a specified limited number of semiconductor regions are formed, as in one MOS transistor element in a CMOS transistor device.

According to the present invention, gettering sites are formed by the p-type conductivity imparting impurity elements ion-implanted into the front major surface of a semiconductor substrate, or the ion-implanted impurities together with clusters of defects formed by such ion implantation. These gettering sites absorb heavy metal contaminants (transition metals, in particular). The leakage current at the pn junction, which results from the contaminants, can be reduced, making it possible to enhance the yield of the semiconductor elements. Moreover, since the gettering is effectively performed at an intermediate stage of the manufacturing process of the device or near the end of the process, the effect of the gettering does not lessen as the succeeding thermal steps are performed to manufacture semiconductor device, unlike in the known method wherein gettering sites are formed on the back of the semiconductor substrate in an early stage of the process.

As has been described, in the present invention, centers of trapping free electrons or holes can be formed in that upper portion of the ion-implanted layer which is near the front major surface of the semiconductor substrate. These centers in the ion-implanted layer trap excess carriers generated by irradiation of α-rays, thus improving the soft-error resistance of the memory device, and also enhancing the yield and reliability of the memory device.

The present invention will now be described in detail, with reference to the accompanying drawings.

FIGS. 1A to 1E explain how a CMOS transistor device can be manufactured on a semiconductor substrate by a method according to the present invention.

The CMOS device is manufactured as will be explained as follows.

First, as is shown in FIG. 1A, boron is selectively ion-implanted under an acceleration voltage of 160 keV in a dose of $1.5 \times 10^{13}/cm^2$ into an n-type silicon substrate 11 having a resistivity of 10 Ωcm and a (100) crystal surface, more precisely into that regions of the substrate 11 in which n-channel MOS transistors will be formed. Then, the substrate 11 is heated at 1190° C. for eight hours, forming p-type wells 12a and 12b, so that the substrate 11 has a p-channel MOS region and two n-channel MOS regions.

Next, as is illustrated in FIG. 1B, a relatively thick field oxide film 13 having a thickness of, for example, 7000 Å is formed on the selected portions of the substrate 11, thereby defining a plurality of regions in which semiconductor elements will be formed. Further, a thin oxide film 14 providing gate oxide films and having a thickness ranging from 100 to 200 Å is formed on the surface of the substrate 11. A phosphorus-doped, $n^+$-type polysilicon film is formed on the surface of the structure and subsequently patterned by means of ordinary photolithography, thereby forming gate electrodes 15a to 15c. An impurity of a desired conductivity type is ion-implanted into the surface region of the substrate 11, by using the gate electrodes 15a, 15b and 15c and the field oxide film 13 as mask, forming self-aligned $p^+$-type layers 16a and 16b and self-aligned $n^+$-type layers 17a to 17e, acting as source and drain regions of the p- and n-channel MOS transistors. Note that when the p-type impurity is ion-implanted into the p-channel MOS region, the n-channel MOS regions are masked with a photoresist. Conversely, when the n-type impurity is ion-implanted into the n-channel MOS regions, the p-channel MOS region is masked with a photoresist. Arsenic can be used as n-type impurity, and boron or boron fluoride can be used as p-type impurity.

Thereafter, referring to FIG. 1C, a CVD oxide film 18 is formed on the entire surface of the structure. Openings are made in the film 18, thus exposing the n-type region 17a. A second polysilicon film 19 is deposited on the entire surface of the structure and is patterned by means of the ordinary photolithography. All heat treatments that need to be performed at temperatures 600° C. or more to manufacture this CMOS device have now been finished in the steps explained with reference to FIGS. 1A to 1C. The unfinished device is covered with an insulating film 20 having a thickness of 4000 Å. The film 20 is made of phosphorus glass such as PSG or BPSG, like insulating films used in most CMOS devices of this type.

Next, boron is ion-implanted under an acceleration voltage of 1 MeV in a dose of $1 \times 10^{15}/cm^2$ into selected portions of the p-channel MOS region and the n-channel MOS regions through the layers formed on the substrate 11, thereby forming ion-implanted layers 21 (nuclei of crystal defects), as is illustrated in FIG. 1D. These ion-implanted layers 21 are located close to, and deeper than, the pn junctions and the depletion layer which will be formed when an operating voltage is applied to the device.

Finally, as is shown in FIG. 1E, openings are made in the insulating film 20, metallization is performed, forming a conductive film, and the conductive film is processed into a fine wiring pattern 22. Then, the unfinished device is heated in a forming gas at 450° C. for 15 minutes. This heat treatment also enables the ion-implanted layers 21 to perform gettering. A passivation film 23 is then deposited on the entire surface of the unfinished device, whereby the LSI having MOS transistors is manufactured. Although not shown for simplicity's sake, inversion-preventing layers are formed below the field oxide film 13. Needless to say, the ion-implanted layers 21 are located below these inversion-preventing layers.

The method described with reference to FIGS. 1A to 1E is nothing more than an example. According to the invention, steps more or less than those described above may be performed in a different order, in accordance with the specifications of the semiconductor device to manufacture. Preferably, the heat treatment for gettering, after the ion-implantation step is carried out at a temperature ranging from 300° to 600° C. If it is conducted at a temperature higher than 600° C., the defect clusters will be annealed dead out. On the other hand, if it is conducted at a temperature less than 300° C., the ions of heavy metals or the like do not move sufficiently, rendering it impossible to achieve gettering as efficiently as is desired. The time for this heat treatment is not an important factor, but should be long enough to accomplish adequate gettering; preferably, it is 15 minutes or more. An element other than boron may be used for the ion-implantation to form gettering sites; more specifically, carbon, oxygen, or silicon may be ion-implanted for this purpose. Further, other elements other than these may be ion-implanted for this purpose.

As has been described, gettering sites are formed by ion-implantation, from the front major surface of the substrate, of a suitable element in a region or regions in the silicon substrate 11, which are deeper than the pn junctions and the depletion layers formed when an operating voltage is applied to the device, and effective gettering can be performed at the final stages of the manufacturing process of the device by optimizing heating conditions (at a temperature ranging from 300° to 600° C.). Further, the gettering sites (nuclei of crystal defects 21) are formed near the front major surface of the substrate or the semiconductor device active regions, and thus can absorb contaminants including the heavy metals, more efficiently than gettering sites formed in the back of the substrate 11. Hence, the leakage current, which flows through the pn junction due to the heavy-metal contamination, is controlled to a desired degree, successfully enhancing the yield of the semiconductor elements.

FIG. 2 is a graph representing the voltage-leakage current characteristics (curve a) observed in CMOS transistor device manufactured as described above, and also the voltage-leakage current characteristics (curve b) observed in a conventional CMOS device in which no ion-implantation has been performed for the formation of the gettering sites according to the invention. As the graph clearly shows, the leakage current flowing in the CMOS device of the invention is small, one order of magnitude less than that flowing in the conventional CMOS device. Further, since the gettering is effectively performed at the desired stage of the manufacturing process of the device or after all high-temperature treatments, which are most likely to introduce the contaminants into the substrate, are finished, according to the invention, the ability of the gettering sites to absorb contaminants does not decrease much as in the case where the gettering sites are formed in the back of the substrate at early stages of the process.

FIGS. 3A to 3E are sectional views for illustrating a method of manufacturing a dynamic RAM cell according to a a second embodiment of the invention. With reference to these figures, it will now be described how the dynamic RAM cell is manufactured.

First, as is shown in FIG. 3A, a field oxide film 32 is selectively formed on a p-type silicon substrate 31 having a resistivity about 10 Ωcm. Then, a CVD oxide film 33 having a thickness of about 0.8 μm is deposited on the entire surface of the substrate 31. The film 33 is subjected to ordinary photolithography, thus forming an opening and exposing that region (hereinafter called "capacitor region") of the substrate 31 in which the capacitor of the dynamic RAM cell will be formed.

Then, as is illustrated in FIG. 3B, a groove 34 having a vertical side wall surface and a depth of about 2 μm is formed in the capacitor region through the opening made in the oxide film 33. The vertical groove 34 can be formed by means of reactive ion etching (RIE), using the CVD oxide film 33 as mask and an etchant gas whose main component is, for example, $CF_4$, $SF_6$, or $CCl_4$, or an etchant gas whose main components is one of these gases and $H_2$. The mask for use in this RIE must not be a photoresist which may be etched away by RIE; preferably, the mask is, for example, a $SiO_2/Si_3N_4/SiO_2$ three-layer film formed by CVD.

Next, as is shown in FIG. 3C, the CVD oxide film 33 is etched away from the surface of the unfinished device, and an $n^-$-type layer 35 is formed in the exposed surface region of the groove 34. Thereafter, an film 36, which will be used as a capacitor insulating film, is formed by means of thermal oxidation. A first polysilicon layer is deposited in the groove 34 and also on the exposed surface of the substrate 31, and is subsequently patterned, forming a capacitor electrode 37.

Figure 3D:
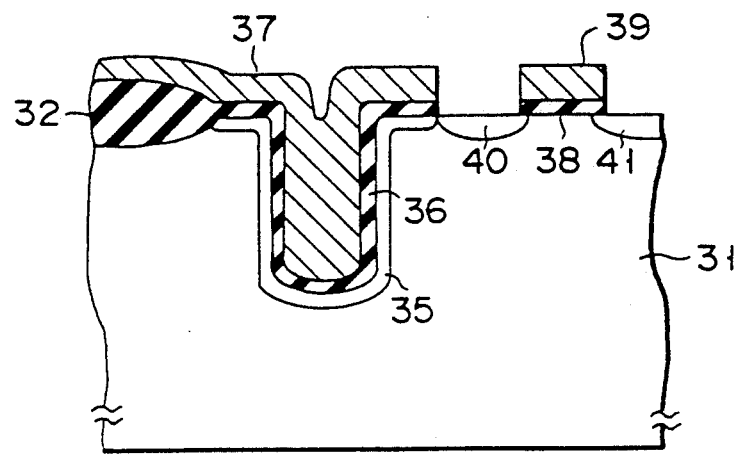

Further, as is shown in FIG. 3D, an oxide film 38, which will be used as a gate insulating layer, is formed near the capacitor region. A second polysilicon layer is deposited on the oxide film 36 and the exposed surface of the substrate 31, and is patterned, thus forming the gate electrode 39 of the dynamic RAM cell. Then, As, for example, is ion-implanted into the substrate 31, thereby forming $n^+$-type layers 40 and 41 in the surface of the substrate 31, which will be the source and drain of the dynamic RAM cell. The thermal oxidation films 36 and 38 can be formed simultaneously. The capacitor electrode 37 and the gate electrode 39 can be formed at the same time.

Figure 3E:
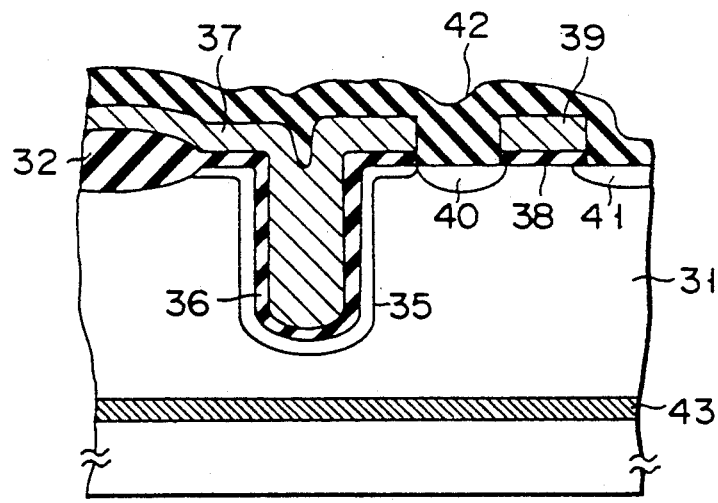

Next, as is shown in FIG. 3E, a CVD oxide film 42 having a thickness of about 4000 Å is formed on the entire surface of the unfinished device. This film 42, which is an insulating film, is made of phosphorus glass such as PSG or BPSG, like insulating films used in most devices of this type. All heat treatments or thermal steps that need to be performed at temperatures of more than 600° C. to manufacture the dynamic RAM cell have now been finished. Thereafter, silicon is ion-implanted into the substrate 31 from the front thereof, in a dose of $1 \times 10^{15}/cm^2$ under an acceleration voltage of 4 MeV, thereby forming nucleus of crystal defects 43 below the groove 34. This nuclei of the crystal defects 43 function as a center of trapping excess free electrons or holes.

Thereafter, metallization is performed, forming a conductive film, and the conductive film is processed into a fine wiring pattern. Then, the unfinished device is heated in a forming gas, for example, $H_2/N_2$ at 450° C. for 15 minutes, as in the manufacturing the CMOS device shown above. This heat treatment also enables the nucleus of crystal defects 43 to perform gettering. Preferably, the heat treatment for gettering, after the ion-implantation step, is carried out at a temperature ranging from 300° to 600° C. The time for this heat treatment should be 15 minutes or more to cure the crystallinity of the surface region of the substrate. As an element to be ion-implanted for the formation of the trapping center of excessive free electrons or holes, carbon or oxygen may also be effectively used.

As has been described, the trapping center of free electrons or holes (i.e., nuclei of crystal defects 43) is formed within the silicon substrate 11, near the front thereof. This trapping center can trap excess carriers generated due to radiation such as α-rays. Hence, the dynamic RAM cell is of a sufficient soft-error resistance, can be manufactured with a high yield, and can operate very reliably.

Figure 4:
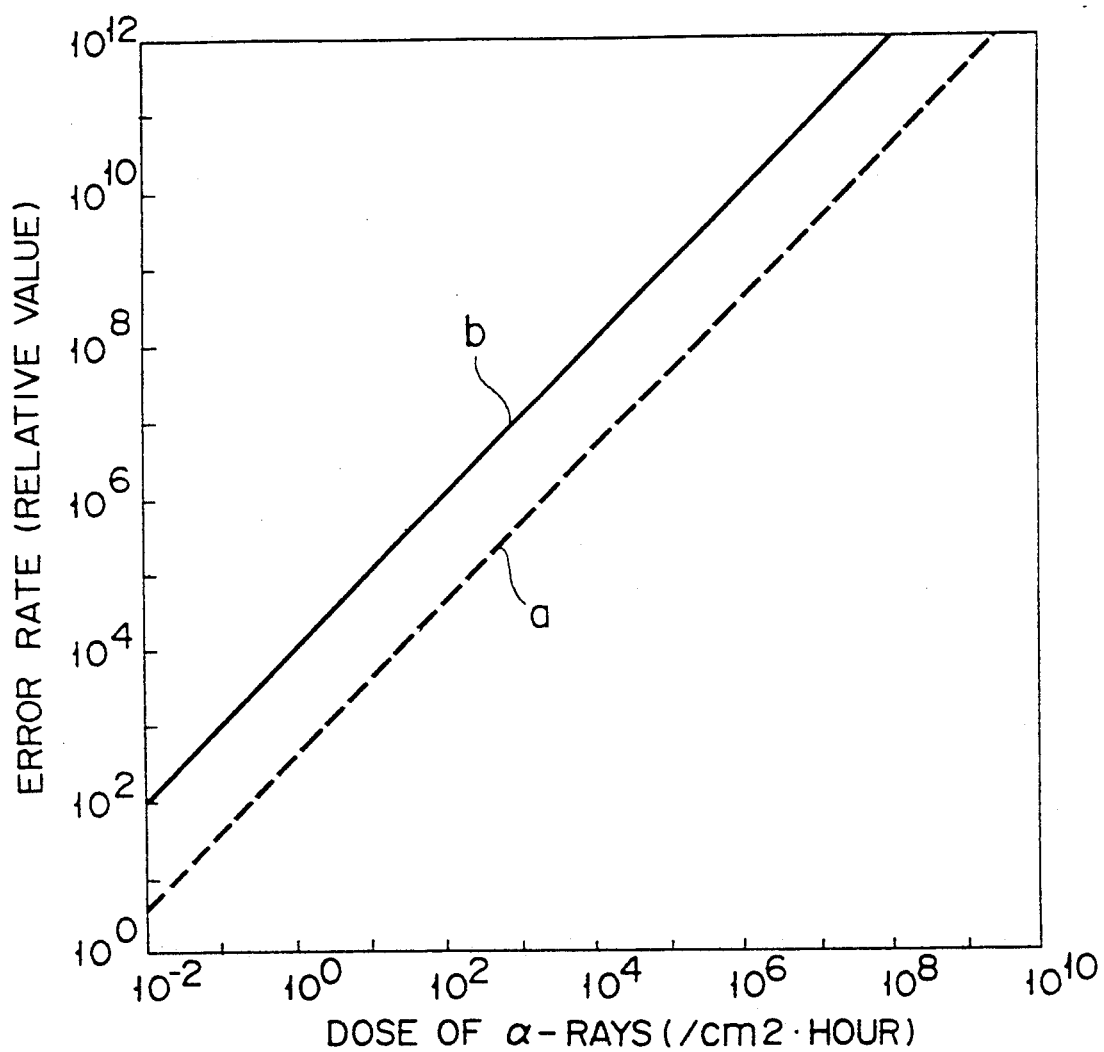
FIG. 4 is a graph illustrating the relationship between the α-ray dose applied to the RAM cell and the rate of errors made in the RAM cell, and also the α-ray dose-error rate relationship observed in a comparative dynamic RAM cell.

FIG. 4 is a graph illustrating the relationship (curve a) between the α-ray dose applied to the dynamic RAM cell (FIG. 3E) and the rate of errors made in the RAM cell, and also the α-ray dose-error rate relationship (curve b) observed in a conventional dynamic RAM cell. As the graph clearly shows, the error rate of the dynamic RAM cell having an ion-implanted layer is lower by one order of magnitude than that of the conventional dynamic RAM cell.

Figure 5:
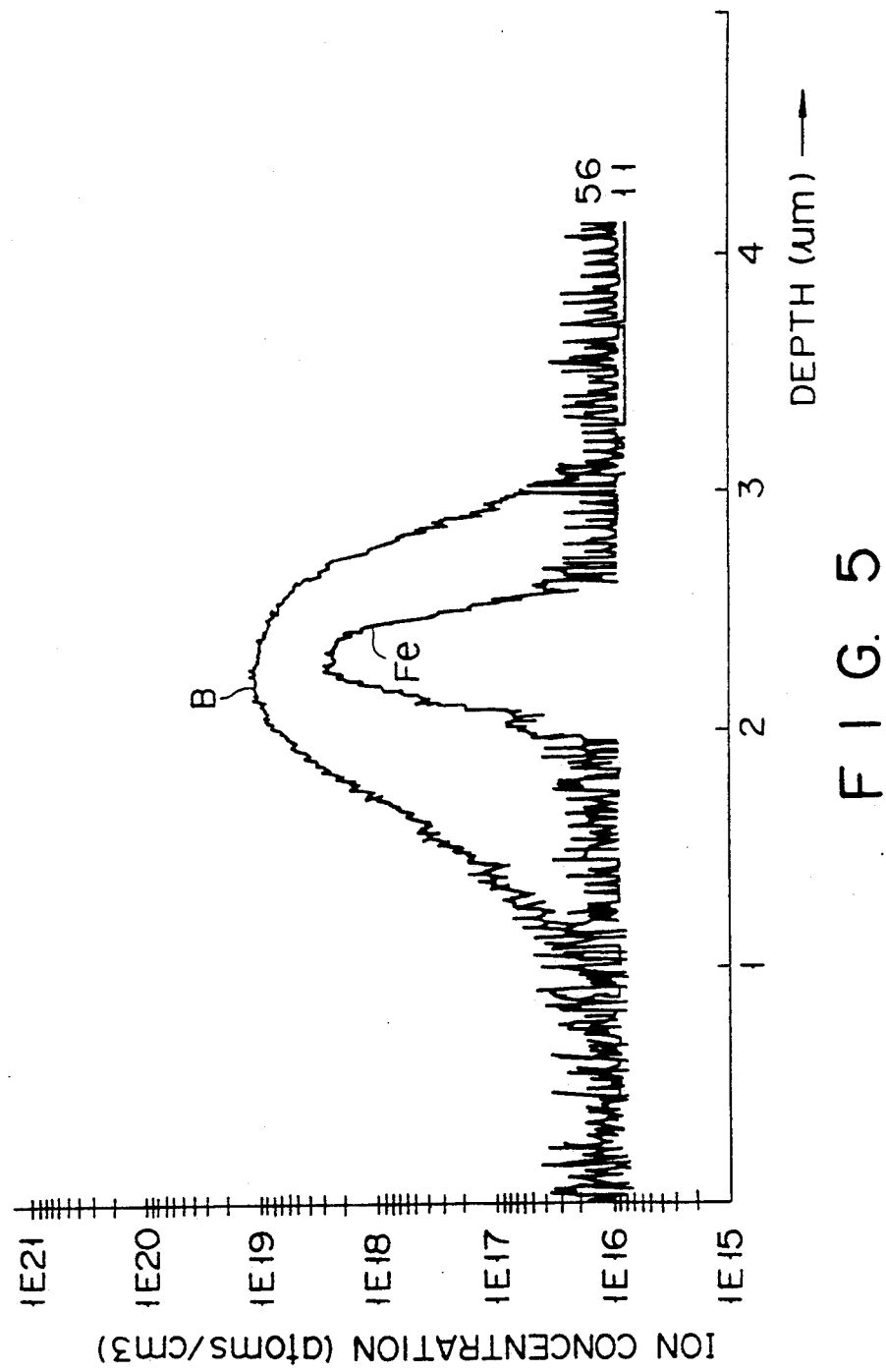
FIG. 5 is a diagram showing the Fe-concentration profile in an ion-implanted layer formed by the method of this invention.

Another mode of the present invention will now be described. The inventors hereof ion-implanted boron (B) into a silicon substrate from the front thereof to a depth of a few microns under an acceleration voltage of 1.5 MeV in a dose of $1 \times 10^{15}/cm^2$, thereby forming nuclei of crystal defects at the depth of a few microns from the surface of the substrate. They then subjected the sample, thus formed, to forced Fe-contamination, and heated the sample at 800° C. for one hour. The boron concentration profile and the iron concentration profile in this sample were determined by means of secondary ion mass spectroscopy. The results of the analysis were as is illustrated in FIG. 5. As FIG. 5 shows, the peak of the iron appeared at the same position as that of the boron, and iron was almost negligible in the other regions. The section of the sample was observed under a transmission electron microscope. The microscope analysis revealed that a dislocation loop was formed at the depth of (Rp×0.9), where Rp is the ion penetration depth, and a non-defect layer was formed in the surface region of the silicon substrate. This fact tells that the iron had been gettered not in the crystal defects such as the dislocation loop, but in the ion-implanted layer. This specific getterinq phenomenon occurred when the substrate was contaminated with iron and heated at a high temperature (800° C. or more) without intervening any such high temperature treatment between the formation of the gettering sites and the heat treatment for gettering. No such a Fe-concentration peak as is shown in FIG. 5 was observed when the substrate was contaminated with iron and heated at that high temperature after the substrate had been pre-heated at, for example 950° C., after the ion-implantation of boron. However, when a heat treatment was performed at a relatively low temperature (450° C. or 600° C.) after ion-implantation of boron, the gettering sites formed by means of the boron implantation remained in the silicon substrate and efficiently gettered iron ions during the high-temperature heat treatment noted above.

The inventors conducted other experiments similar to that described in the preceding paragraph, wherein boron was ion-implanted into substrates in different doses, thus forming several samples. These samples were subjected to secondary ion mass spectroscopy. The results of the analysis showed that iron was efficiently trapped in a region having a high boron concentration of $1 \times 10^{18}/cm^3$ or more. The first high-temperature heat treatment performed after the ion-implantation of boron forms an element surface region having no crystal defects, and makes it possible for the gettering site, which is located near the element surface region, to getter iron ions more efficiently than is possible with the conventional gettering techniques.

In the conventional semiconductor device, to electrically isolate MOS transistors formed in the same semiconductor substrate, the dopant is ion-implanted into the substrate under the field oxide film formed on the substrate. The dopant concentration required for the element isolation under the field oxide falls within a certain range. In this case, the relatively thick field oxide film causes an excessively large stress to be applied to the element isolation region, and contaminant impurities such as heavy metals concentrate in the element isolation region, inevitably rendering it more possible that a leakage current flows in that region. The present invention can solve this problem inherent in the conventional device, without performing an additional step, since the element isolation can be formed simultaneously with the formation of gettering sites.

Figure 6:
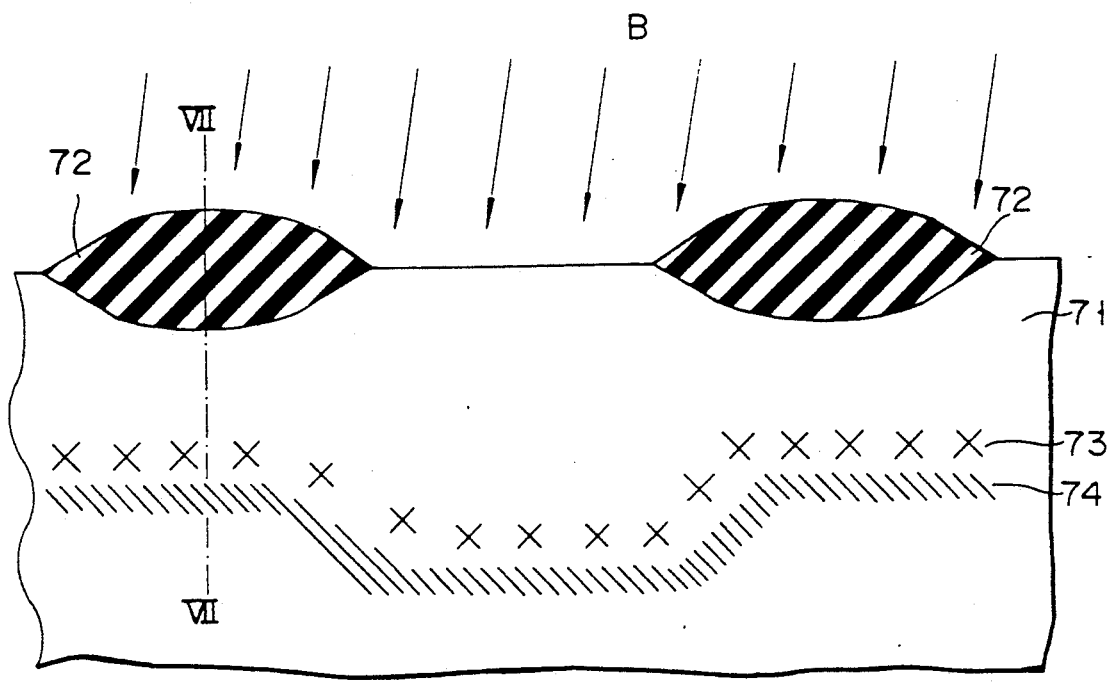
FIG. 6 is a sectional view, explaining a method of forming a gettering site, according to the present invention.

More specifically, as is illustrated in FIG. 6, boron was ion-implanted into a silicon substrate 71 under an acceleration voltage of 1.5 MeV in a dose of $1 \times 10^{15}/cm^2$ after an element-isolating field oxide film 72, 4000 A thick, had been formed on the substrate 71. As a result, secondary defects 73 and a gettering site 74 were formed at the same time.

Figure 7:
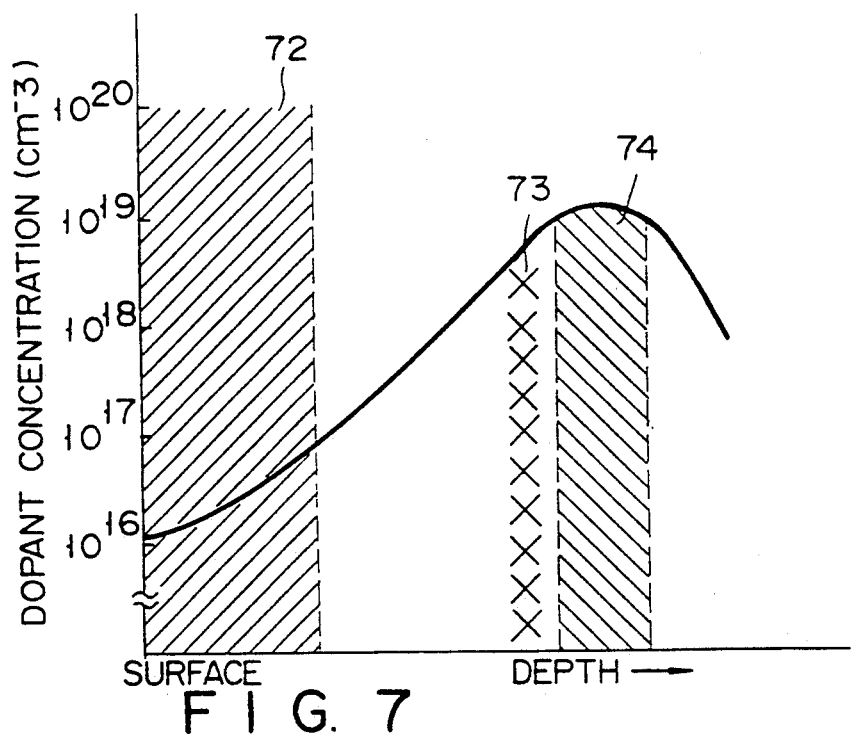
FIG. 7 is a diagram illustrating the concentration profile of the ion-implanted dopant, as is observed in the cross section taken along line VII—VII in FIG. 6.

FIG. 7 is a characteristic diagram illustrating the concentration profile of the implanted dopant, as is observed in the cross section taken along line VII—VII in FIG. 6. As can be understood from FIG. 7, the peak ion concentration was $1 \times 10^{19} cm^3$. After the ion implantation, the unfinished device was heated at 900° C. for one hour. The dopant scarcely diffused again after the heat treatment. The elements were isolated under the field oxide film. At the same time, a gettering site was formed at a position deep enough to getter the impurities concentrated in the element-isolation region due to the excessively large stress applied to the region, without the generation of a leakage current. In some samples the inventors made, the element-isolating field oxide films had different thicknesses. Hence, the dopant was ion-implanted in such a dose that the dopant concentration in the region below the field oxide film was high enough to isolate the elements completely, and under such an acceleration voltage that secondary defects were formed deep enough (0.9 Rp from the surface) to supply no leakage current to the element-isolation region. As a result of this, the same advantage were obtained as in the case where the field oxide films had the same thickness.

Another method according to the present invention will now be described, which is a method of manufacturing a bipolar integrated circuit and in which a gettering site is formed at the same time buried collectors are formed.

Figure 8:
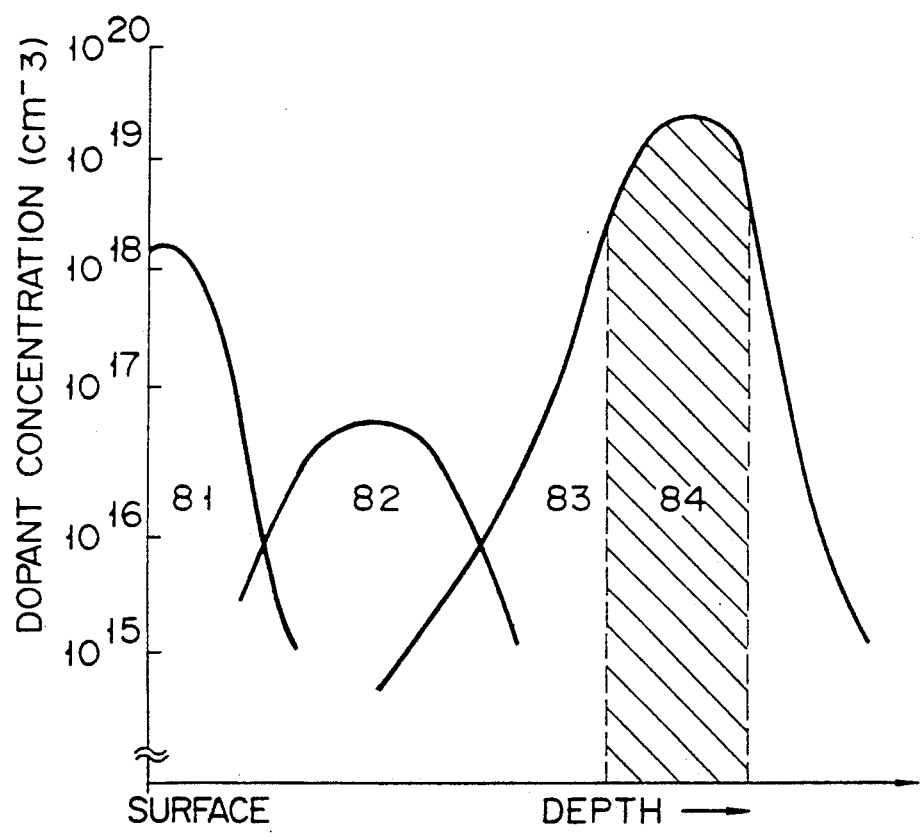
FIG. 8 is a diagram representing the concentration profile of the impurities in a semiconductor device made according to still another embodiment of the present invention.

As is generally known in the art, buried collectors are formed in a bipolar transistor IC, either by epitaxial growth or by ion-implantation into the substrate under a high acceleration voltage. The latter method is used in this embodiment. More specifically, to form the pnp junction shown in FIG. 8, boron was ion-implanted into an n-type silicon substrate under an acceleration voltage of 1.5 MeV in a dose of $1 \times 10^{15}$/cm$^2$ after the emitter region 81 and the base region 82 had been formed in the surface region of the substrate. The peak concentration of boron was $3 \times 10^{19}$/cm$^3$. The unfinished device was heated at a high temperature (800° C. or more) for activation. During this heat treatment, the region 84 having this peak boron concentration was used as a gettering region. The gettering region 84 gettered contaminant heavy metals, and that portion of the ion-implanted region which was near the front surface of the substrate could function as collector region 83.

The characteristics of a bipolar transistor IC greatly depend on the crystallinity of the portion which extends between the surface of the substrate and the depletion layer formed at the pn junction at the base-collector interface. The deeper portion of the substrate does not influence the characteristics of the bipolar transistor IC. In the bipolar transistor IC according to the invention, the gettering site 84 was formed at the same time the semiconductor element was formed, and the contaminants could be removed from the element region. In other words, the gettering site 84 formed without increasing the number of steps of manufacturing the bipolar transistor IC, reliably gettered the contaminants which came into the substrate.

The present invention is not limited to the embodiments described above. Various changes and modifications can be made without departing the scope of the invention. For example, the acceleration voltages or energies applied to form gettering sites is high enough to form the gettering sites including the ion-implanted layer and/or defect clusters deeper than the pn junction and also than the depletion layer which is formed when an operating voltage is applied to the device. Specifically the high energy is 380 keV or more, more preferably 500 keV or more, and most usually 1 MeV or more. Note that this high energy is higher than energies used to form semiconductor elements. Further, the heat treatment for gettering, performed after the ion implantation, is most suitably carried out at a temperature of 800° C. or more. However, even at a lower temperature of 300° C. or more, preferably 300° to 600° C., the gettering can be effected more efficiently than that achieved in the conventional method. Still further, when the buried conductive layer is also formed by the ion-implantation according to the invention, the peak concentration of the implanted impurity may better be $10^{18}$/cm$^3$ or more, so that the ion-implanted layer can function as the conductive layer, too.

Moreover, as has been described in detail, according to the present invention, gettering sites are formed in the substrate, near the front side of thereof, by ion-implantation into a region deeper than an pn junction formed in the substrate, and than the depletion layer, and the gettering is effected by heating the substrate under optimal conditions. Hence, the gettering site is located adequately near the active region of the device, without requiring an additional high-temperature treatment and without degrading the characteristics of the device, thereby helping to improve the yield of the semiconductor elements incorporated in the device. So located, the gettering site can efficiently trap the excess carriers resulting from radiation such as α rays, thus improving the soft-error resistance of the device, and also enhancing the yield and reliability of the semiconductor memory elements incorporated in the device.

What is claimed is:

1. A method of manufacturing a semiconductor device, comprising the steps of:
    forming desired semiconductor elements, including device active regions and interconnections in a major surface region of a semiconductor substrate, including heat treatments at a temperature higher than 600° C., said substrate containing contaminant elements;
    ion-implanting a selected element into the semiconductor substrate in which said semiconductor elements have been formed, from the major surface thereof, thereby forming an ion-implanted layer by the implanted ions located at a position close to and deeper than a depletion layer formed in the semiconductor substrate when a predetermined operating voltage is applied to the semiconductor device; and
    performing a heat treatment at a temperature in the range of about 300° to 600° C., causing said ion-implanted layer to getter said contaminant elements.

2. The method according to claim 1, wherein said selected element is selected from the group consisting of boron, carbon, oxygen, and silicon.

3. The method according to claim 1, wherein said selected element is boron.

4. The method according to claim 1, wherein said semiconductor elements are memory elements.

5. The method according to claim 4, wherein said ion-implanted layer comprises gettering sites and also centers for trapping free electrons or holes.

6. The method according to claim 5, wherein said selected element is selected from the group consisting of silicon, carbon, and oxygen.

7. The method according to claim 1, wherein said ion-implanted layer has a gettering site located near the major surface of the substrate, and also said ion-implanted layer acts as a conductive layer.

8. A method of simultaneously forming a p-type semiconductor region and a gettering site, comprising the steps of:
    selectively ion-implanting a p-conductivity imparting impurity into a semiconductor substrate such that said implanted ion region has a concentration distribution of said impurity from the surface into the substrate, said substrate containing contaminant elements, and said concentration distribution having a peak value of said impurity at a predetermined depth into said substrate, thereby forming a gettering site by the implanted ions in the vicinity of the peak value, and a p-type device active region comprising an implanted ion portion positioned shallower than said gettering site; and
    performing a heat treatment on said semiconductor substrate in which said gettering site is formed, at a predetermined temperature, causing said gettering site to getter contaminant elements.

9. The method according to claim 8, wherein said p-conductivity imparting impurity is boron.

10. The method according to claim 8, wherein said gettering site is formed at a position close to and deeper than a depletion layer formed in the semiconductor substrate when a predetermined operating voltage is applied to the semiconductor device.

11. The method according to claim 8, wherein said low temperature ranges from 300° C. to 600° C.

12. The method according to claim 8, wherein said gettering site is formed at an intermediate stage of the process, and said heat treatment is performed at a temperature of at least 800° C.

* * * * *